(12) United States Patent
Wong et al.

(10) Patent No.: US 10,615,292 B2
(45) Date of Patent: Apr. 7, 2020

(54) HIGH VOLTAGE SILICON CARBIDE SCHOTTKY DIODE FLIP CHIP ARRAY

(71) Applicant: Hong Kong Applied Science and Technology Research Institute Co., Ltd., Shatin (HK)

(72) Inventors: Siu Wai Wong, Junk Bay (HK); Shu Kin Yau, Junk Bay (HK)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 0 days.

(21) Appl. No.: 15/936,903

(22) Filed: Mar. 27, 2018

(65) Prior Publication Data

US 2019/0305141 A1   Oct. 3, 2019

(51) Int. Cl.
*H01L 29/872* (2006.01)
*H01L 29/16* (2006.01)
(Continued)

(52) U.S. Cl.
CPC ...... *H01L 29/872* (2013.01); *H01L 21/02378* (2013.01); *H01L 21/02529* (2013.01); *H01L 21/02634* (2013.01); *H01L 21/046* (2013.01); *H01L 21/0475* (2013.01); *H01L 21/0485* (2013.01); *H01L 23/3171* (2013.01);
(Continued)

(58) Field of Classification Search
None
See application file for complete search history.

(56) References Cited

U.S. PATENT DOCUMENTS

| 4,908,679 | A | | 3/1990 | Vora et al. |
| 5,506,421 | A | * | 4/1996 | Palmour ............. H01L 29/7813 |
| | | | | 257/77 |

(Continued)

FOREIGN PATENT DOCUMENTS

| CN | 101540343 | 9/2009 |
| CN | 105938848 | 5/2012 |

(Continued)

OTHER PUBLICATIONS

WO PCT/CN2018/082175 Search Rept., dated Jan. 4, 2019, Hong Kong Applied Sci. Tech. R.

(Continued)

*Primary Examiner* — Andres Munoz
(74) *Attorney, Agent, or Firm* — Wells St. John P.S.

(57) ABSTRACT

A silicon carbide chip array containing a silicon carbide substrate; a silicon carbide layer on top of the silicon carbide substrate; a first metal contact connected to the silicon carbide substrate; and two second metal contacts connected to the first portion and the second portion respectively. The silicon carbide layer is thinner and having lower doping than the silicon carbide layer. The silicon carbide layer includes a first portion and a second portion which are separate from each other. Each one of the second metal contacts forms a semiconductor device with the first metal contact. At least one of the first and second portions contains a side face which is inclined with respect to the silicon carbide substrate. Such a configuration enhances the breakdown voltage and reduces leakage current of the resultant silicon carbide diode array.

17 Claims, 6 Drawing Sheets

(51) Int. Cl.
  *H01L 29/45* (2006.01)
  *H01L 29/417* (2006.01)
  *H01L 21/04* (2006.01)
  *H01L 29/66* (2006.01)
  *H01L 27/08* (2006.01)
  *H01L 21/02* (2006.01)
  *H01L 29/06* (2006.01)
  *H01L 23/31* (2006.01)

(52) U.S. Cl.
  CPC ...... *H01L 27/0814* (2013.01); *H01L 29/0657* (2013.01); *H01L 29/1608* (2013.01); *H01L 29/417* (2013.01); *H01L 29/45* (2013.01); *H01L 29/6606* (2013.01)

(56) References Cited

U.S. PATENT DOCUMENTS

| | | | |
|---|---|---|---|
| 5,612,567 A * | 3/1997 | Baliga | H01L 29/872 |
| 5,841,197 A | 11/1998 | Adamic, Jr. | |
| 6,362,495 B1 * | 3/2002 | Schoen | H01L 29/1608 |
| | | | 257/471 |
| 6,576,973 B2 | 6/2003 | Collard et al. | |
| 6,734,520 B2 | 5/2004 | Kapels et al. | |
| 7,166,894 B2 * | 1/2007 | Templier | H01L 21/0475 |
| | | | 257/287 |
| 7,816,733 B2 | 10/2010 | Okuno et al. | |
| 7,960,198 B2 * | 6/2011 | Sankin | H01L 29/0619 |
| | | | 257/409 |
| 8,736,013 B2 | 5/2014 | Nassar et al. | |
| 9,224,877 B2 * | 12/2015 | Hiyoshi | H01L 29/872 |
| 9,236,500 B2 | 1/2016 | Lee et al. | |
| 9,406,661 B2 | 8/2016 | Zhu et al. | |
| 9,627,553 B2 * | 4/2017 | Richieri | H01L 29/872 |
| 9,972,725 B2 * | 5/2018 | Hasegawa | H01L 29/872 |
| 2001/0054715 A1 | 12/2001 | Collard et al. | |
| 2004/0212011 A1 * | 10/2004 | Ryu | H01L 29/66068 |
| | | | 257/335 |
| 2006/0214268 A1 * | 9/2006 | Maeyama | H01L 29/045 |
| | | | 257/628 |
| 2007/0228505 A1 * | 10/2007 | Mazzola | H01L 29/8611 |
| | | | 257/471 |
| 2008/0277669 A1 | 11/2008 | Okuno et al. | |
| 2010/0237356 A1 * | 9/2010 | Haney | H01L 29/1608 |
| | | | 257/77 |
| 2014/0284615 A1 * | 9/2014 | Mauder | H01L 21/3085 |
| | | | 257/77 |
| 2015/0069412 A1 | 3/2015 | Lee et al. | |
| 2016/0254393 A1 | 9/2016 | Ohse et al. | |
| 2018/0254354 A1 * | 9/2018 | Kawahara | H01L 29/06 |

FOREIGN PATENT DOCUMENTS

| | | |
|---|---|---|
| CN | 104425630 | 3/2015 |
| CN | 105765698 | 7/2016 |
| CN | 105938848 | 9/2016 |
| CN | 106299050 | 1/2017 |

OTHER PUBLICATIONS

WO PCT/CN2018/082175 Writ. Opin., dated Jan. 4, 2019, Hong Kong Applied Sci. Tech. R.

\* cited by examiner

HIGH VOLTAGE SILICON CARBIDE SCHOTTKY DIODE FLIP CHIP ARRAY

FIELD OF INVENTION

This invention relates to semiconductor devices, and in particular to silicon carbide diodes.

BACKGROUND OF INVENTION

Figure 1:
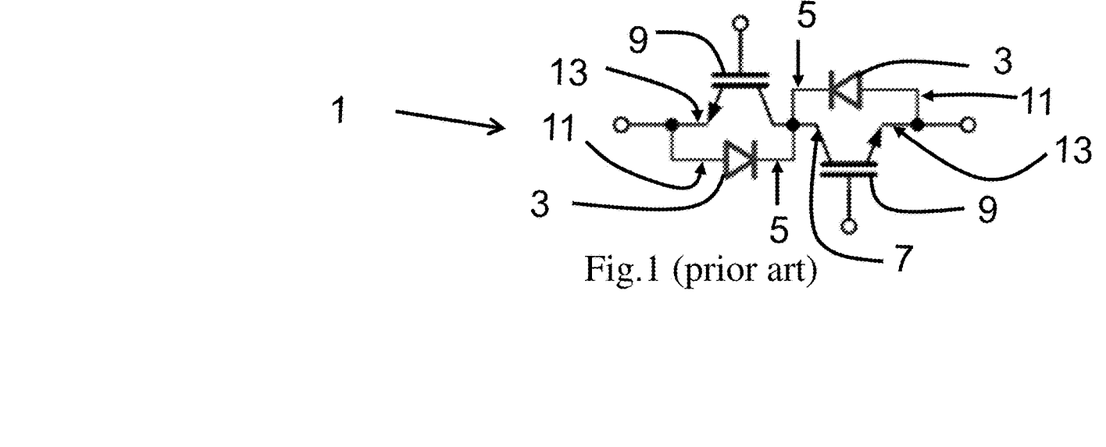
FIG. 1 shows the schematic diagram of a conventional bi-directional switch.

Diode pairs are commonly used in power applications such as AC/AC converters. For example, an AC/AC converter may contain a bidirectional switch 1 (as shown in FIG. 1) which contains two diodes 3 with their cathodes 5 and also collectors 7 of two Insulated Gate Bipolar Transistor (IGBT) 9 all connected together, while the anodes 11 of the two diodes 3 connected respectively to the emitters 13 of the two IGBT 9. The two diodes 3 forms a diode pair in the above bidirectional switch 1.

A common approach to implement the diode pair is to use silicon carbide (SiC) diodes which form an array. Silicon carbide allows Schottky type diodes to be made. These diodes have static performances comparable to those manufactured from silicon. Moreover, silicon carbide based Schottky diodes do not suffer from switching losses. However, existing silicon carbide diodes often suffer from other problems including but not limited to large forward leak current and small reverse breakdown voltage, which deteriorate the performance of the silicon carbide diodes.

SUMMARY OF INVENTION

In the light of the foregoing background, it is an object of the present invention to provide an alternate silicon carbide diode array which eliminates or at least alleviates the above technical problems.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention, in one aspect is a silicon carbide chip array, containing a silicon carbide substrate; a silicon carbide layer on top of the silicon carbide substrate; a first metal contact connected to the silicon carbide substrate; and two second metal contacts connected to the first portion and the second portion respectively. The silicon carbide layer is thinner and having lower doping than the silicon carbide layer. The silicon carbide layer includes a first portion and a second portion which are separate from each other. Each one of the second metal contacts forms a semiconductor device with the first metal contact. At least one of the first and second portions contains a side face which is inclined with respect to the silicon carbide substrate.

Preferably, the first portion and the second portion each contain one side face that is opposing each other. The first metal contact is located between the two side faces.

More preferably, the at least one of the first and second portions further contains, at least partially along the side face, a plurality of p-type silicon carbides.

According to a variation of the preferred embodiments, the plurality of p-type silicon carbides is buried under the side face at a distance.

Alternatively, the plurality of p-type silicon carbides has edges thereof substantially contacting the side face.

According to another variation of the preferred embodiments, the first metal contact functions as a common cathode, and the second metal contacts function as anodes respectively.

According to a further variation of the preferred embodiments, the semiconductor device is a diode, such that the silicon carbide chip array forms a diode pair.

In one specific implementation, the first metal contact or the second metal contacts are formed by seed layer deposition and subsequent electroplating.

In another specific implementation, an inclined trench depth is from 2 μm to 300 μm.

In a further specific implementation, the silicon carbide chip array further contains a dielectric layer on top of the silicon carbide substrate, the dielectric layer fully encapsulating the silicon carbide layer.

Preferably, the dielectric layer is made of a material which is adapted to prevent a reverse leakage current or breakdown between the first metal contacts and the side face.

In a further specific implementation, the first metal contact or the second metal contacts are made of a metal selected from the followings: titanium (Ti), nickel (Ni), titanium nitride (TiN), titanium aluminum (TiAl) and platinum (Pt).

In a further specific implementation, the side face forms an angle equal to or greater than 45° with a top face of the silicon carbide substrate.

In another aspect of the present invention, a method of producing a silicon carbide chip array includes the steps of providing a silicon carbide layer on top of a silicon carbide substrate, where the silicon carbide layer being thinner and having lower doping than the silicon carbide substrate; forming a first portion and a second portion from the silicon carbide layer; where at least one of the first and second portions contains a side face which is inclined with respect to the silicon carbide substrate; forming a first metal plate on the silicon carbide substrate; and forming two second metal plates on the first portion and the second portion respectively.

Preferably, the step of forming the first portion and the second portion further includes the steps of masking and etching.

More preferably, the method further includes the step of forming a plurality of p-type silicon carbides at least partially along the side face.

In one specific implementation, the step of forming a plurality of p-type silicon carbides further includes implanting the p-type impurity and subjecting to annealing.

In another specific implementation, the step of forming a plurality of p-type silicon carbides further contains the step of growing an additional layer on top of the silicon carbide layer to cover the p-type silicon carbides.

In a further specific implementation, the method further includes the step of depositing a layer of dielectric material on the silicon carbide layer.

BRIEF DESCRIPTION OF FIGURES

The foregoing and further features of the present invention will be apparent from the following description of preferred embodiments which are provided by way of example only in connection with the accompanying figures, of which.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated.

Terms such as "horizontal", "vertical", "upwards", "downwards", "above", "below" and similar terms as used herein are for the purpose of describing the invention in its normal in-use orientation and are not intended to limit the invention to any particular orientation.

Figure 2:
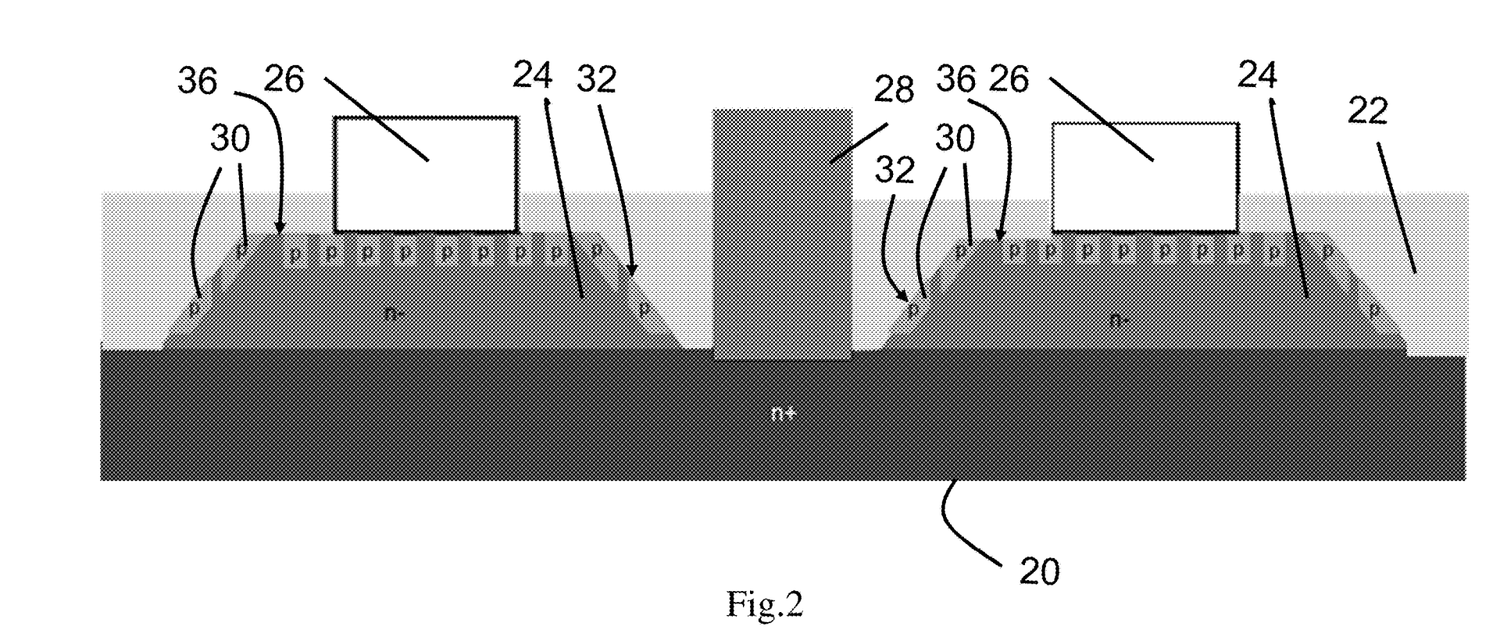
FIG. 2 is the cross-sectional illustration of a silicon carbide diode array according to a first embodiment of the present invention.

Referring now to FIG. 2, the first embodiment of the present invention is a silicon carbide diode array which contains a silicon carbide substrate 20 as the underlying structure of the device. As skilled persons would understand, the silicon carbide substrate 20 is made from SiC wafers, and the silicon carbide substrate 20 is of n+ type. On top of the silicon carbide substrate 20, there is a silicon carbide layer of n− type which is split into two portions 24. The silicon carbide layer is thinner and has lower doping than the silicon carbide substrate 20. The two portions 24 are not physically connected to each other, but instead are separated from each other with a common cathode 28 therebetween. Each portion 24 of the silicon carbide layer, as can be observed in FIG. 2, exhibits the shape of a trapezoid. This is because the two sides faces 32 of each portion 24 are both inclined with respective to the silicon carbide substrate 20 such that the side face 32 forms an acute angle with the silicon carbide substrate 20. The acute angle is preferably equal to or larger than 45°, and more preferably in the range of 45°-60°. A plurality of p-type silicon carbides 30 are configured on a top face 36 as well as on the two side faces 32 of each portion 24. The p-type silicon carbides 30 for example can be formed by a p-type impurity implantation and then with annealing performed, as will be described in more details later. The p-type silicon carbides 30 are implanted at a position lower than the above mentioned faces, but nevertheless each one of the p-type silicon carbides 30 has an edge substantially contacting the above-mentioned faces. As one can see from FIG. 2, the p-type silicon carbides 30 are evenly distributed on the top face 36, whereas on each side face 32 there are two p-type silicon carbides 30.

The cathode 28 is in the form of a first metal plate deposited on the silicon carbide substrate 20. The metal is any suitable type which attains to form a Schottky junction with the silicon carbide substrate 20. Examples of such materials include Titanium (Ti), Nickel (Ni), Titanium nitride (TiN), Titanium aluminum (TiAl), Platinum (Pt) and the like. A similar, second metal plate is connected to the top faces 36 of the portions 24 of the silicon carbide layer, and the second metal plates form the two anodes 26 respectively. Both the cathode 28 and the anodes 26 are formed on the respect metal plates by seed layer deposition and subsequently electroplating, as will be described in more details later.

A layer 22 of dielectric material is also deposited on top of the silicon carbide substrate 20, and the dielectric layer 22 fully encapsulates the above-mentioned portions 24 of the silicon carbide layer such that the top face 36 is also covered by the dielectric layer 22. The dielectric layer 22 is made of a material which prevents the reverse leakage current or breakdown between the common cathode 28 and the side faces 32. The dielectric layer 22 does not cover the entirety of the cathode 28 and the anodes 26 which protrude from the dielectric layer 22 for the purpose of flip chip bonding.

The silicon carbide diode array as described above contains many advantages. For example, by configuring a topside anode and cathode structure with the anodes and cathode connected to the top face of silicon carbide substrate and/or the silicon carbide layer, the resultant silicon carbide array is ready for applying flip chip bonding. The flip chip bonding eliminates wires which would otherwise be necessary for connecting the electrodes, provides a better thermal dissipation, and reduces parasitic inductance (EMI). Flip chip packaging together with silicon carbide devices implementation could improve the efficiency and power density of power modules by lower inductance and better thermal capability.

In addition, in the silicon carbide diode array, two diodes are combined into one and sharing a common cathode. Such a configuration makes the silicon carbide diode array instantly ready for power module applications. In addition, the cathode area of previous separated diodes could be contributed to Schottky active anode area for up to 50% increase in the current density. The two anodes have their side face opposing the common cathode in an inclined configuration (e.g. the shape of an inclined trench), and such side face provides a wider termination to reduce and/or spread the electric field as compared to a side face vertical to the substrate, and the inclined side face therefore reduces leakage current and enhance reverse breakdown voltage.

Figure 3:
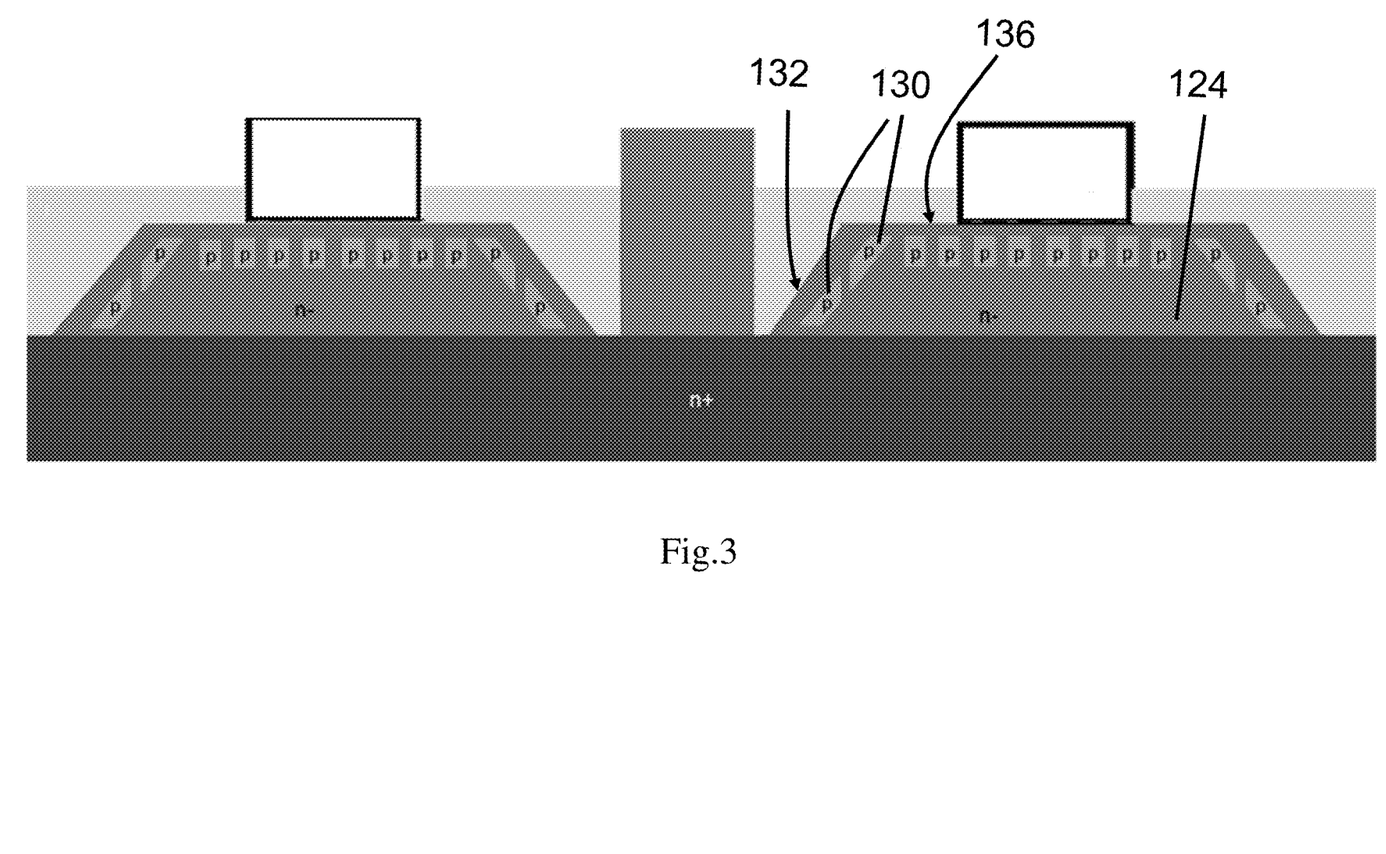
FIG. 3 is the cross-sectional illustration of a silicon carbide diode array according to another embodiment of the present invention.

Turning now to FIG. 3, another embodiment of the present invention shows a silicon carbide diode array. Most of the features of the silicon carbide diode array are similar to those of the silicon carbide diode array in FIG. 2 so they will not be described again here for the sake of brevity. Only the difference between the silicon carbide diode arrays in FIG. 3 and FIG. 2 will be described herein. In FIG. 3, one can see that the p-type silicon carbides 130 are "buried" at a distance under the top face 136 as well the side faces 132 of each portion 124 of the silicon carbide layer. By mentioning "at a distance" it means that none of the edges of the p-type silicon carbide 130 contacts the surfaces of the above-mentioned faces 136, 132. Such a burying configuration further reduces leakage current and enhance the reverse breakdown voltage and of the resultant silicon carbide diode array.

Figure 4:
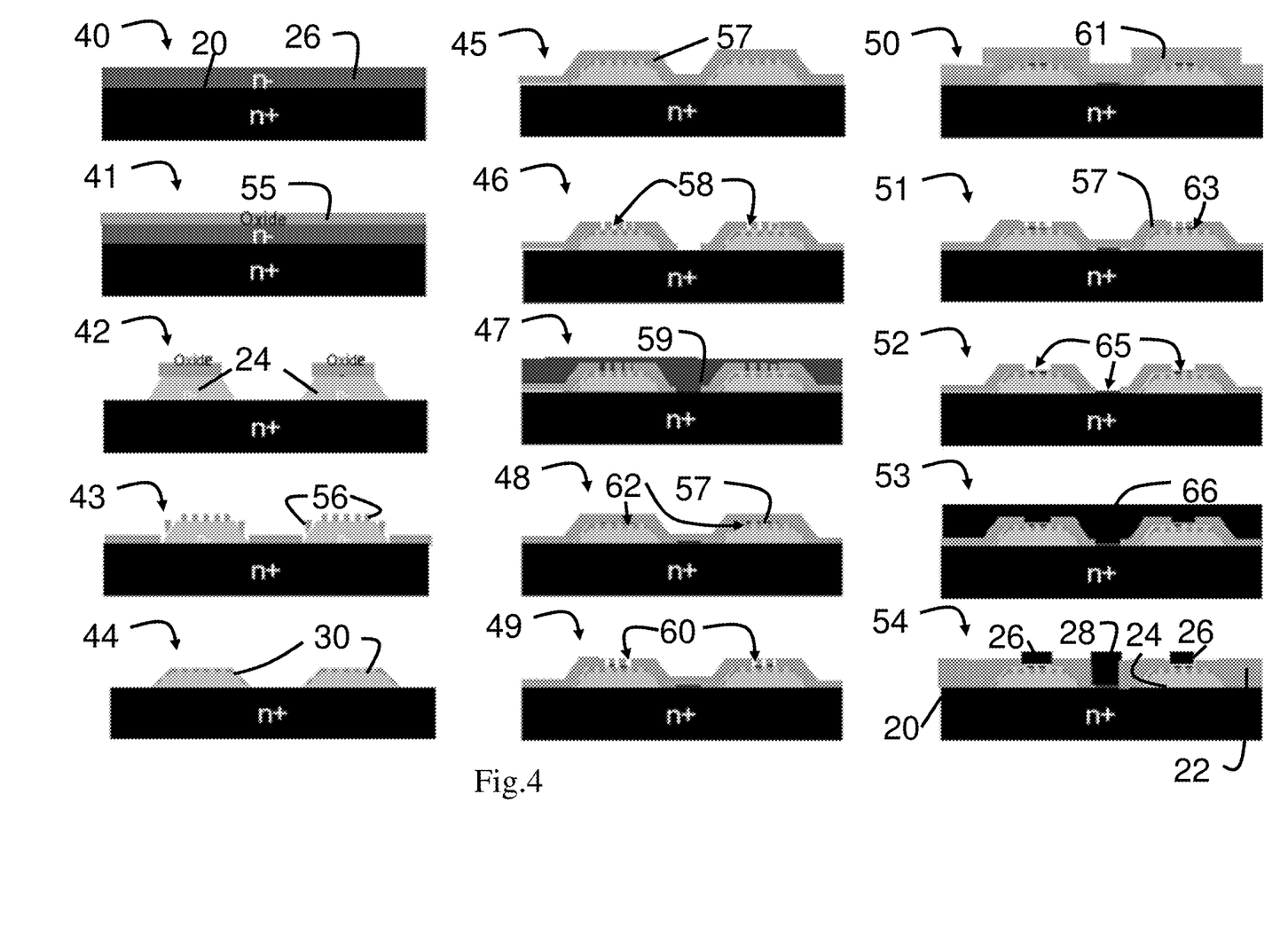
FIG. 4 shows the method steps of forming the silicon carbide diode array in FIG. 2.

FIG. 4 shows an exemplary method of how to produce the silicon carbide diode array in FIG. 2. Note that the exemplary method described in this embodiment is not intended to be limiting, as the same silicon carbide diode array may be produced using other methods, and/or with different sequences of the steps. The method starts at Step 40 in which a raw silicon carbide epi wafer which has been cleaned using the RCA clean procedures is prepared. The wafer comes with a silicon carbide substrate 20 of n+ type and a silicon carbide layer on top thereof which is of n− type. Then, in Step 41 thermal oxidation and Chemical Vapor Deposition (CVD) is performed on the wafer, and in particular on the top side of the silicon carbide layer, so that a layer of oxide 55 is formed on the surface of the wafer. In Step 42, an oxide hard mask layer formed by a resist pattern (not shown) through photolithography and oxide etching process, and proceeding for the silicon carbide layer etching process, resulting in separate portions 24 of the silicon carbide layer each with the trapezoidal-shaped cross-sections as mentioned above. The inclined side faces of the portions of the silicon carbide layer thus form the inclined trench. In Step 43, the oxide layer is etched, and then a p implantation resist pattern 56 is formed by photolithography on the top face as well the side faces of the portions of the silicon carbide layer. Next, in Step 44 p-type impurity implantation, resist removal and annealing process are performed, and then p-type silicon carbides 30 are formed on the surface of the silicon carbide layer, and the p-type silicon carbides 30 undergoes an annealing process. Next, in Step 45, an Inter-Layer Dielectric (ILD) material 57 is deposited on top of the entire device including the portions of the silicon carbide layer as well as the silicon carbide substrate. In Step 46, some portions of the ILD material 57 are patterned by photolithography and etching process on the top face of the portions of the silicon carbide layer, leaving contacts 58 for the ohmic metal later. In Step 47, a layer of ohmic metal 59 is deposited on the entire device, and the ohmic metal 59 fills in the previously mentioned contacts 58 and then undergoes an annealing process. The ohmic contacts 62 of the silicon carbide diode array are thus formed. In Step 48, the excess metal above the ILD material 57 is then removed, and the ILD material 57 is deposited again to ensure an even coverage on the entire device for the next step. In Step 49, some portions of the ILD material 57 are patterned by photolithography and etching process on the top face of the portions of the silicon carbide layer, leaving contacts 60 for the Schottky metal later. In Step 50, a layer of Schottky metal 61 is deposited on the entire device, and the Schottky metal 61 fills in the previously mentioned contacts 60 and then undergoes an annealing process. The Schottky contacts 63 of the silicon carbide diode array are thus formed. In Step 51, the excess metal above the ILD material 57 is then removed, and the ILD material 57 is deposited again to ensure an even coverage on the entire device for the next step. In Step 52, a resist pattern is formed by photolithography and then oxide etching process is performed, leaving contacts 65 for interconnecting electrode metal later. In Step 53, an electrode seed layer (not shown) is sputtered and then it interconnects metal 66 by electroplating formed on the entire device. In Step 54, by resist pattern (not shown) through photolithography and oxide etching process on interconnect metal 66, the anodes 26 on top of the portions 24 of the silicon carbide layer, and on common cathode 28 on the silicon carbide substrate 20 are formed. A dielectric layer 22 is then deposited, and finally PAD masking and etching are performed. The resultant device is then a silicon carbide diode array.

Figure 5:
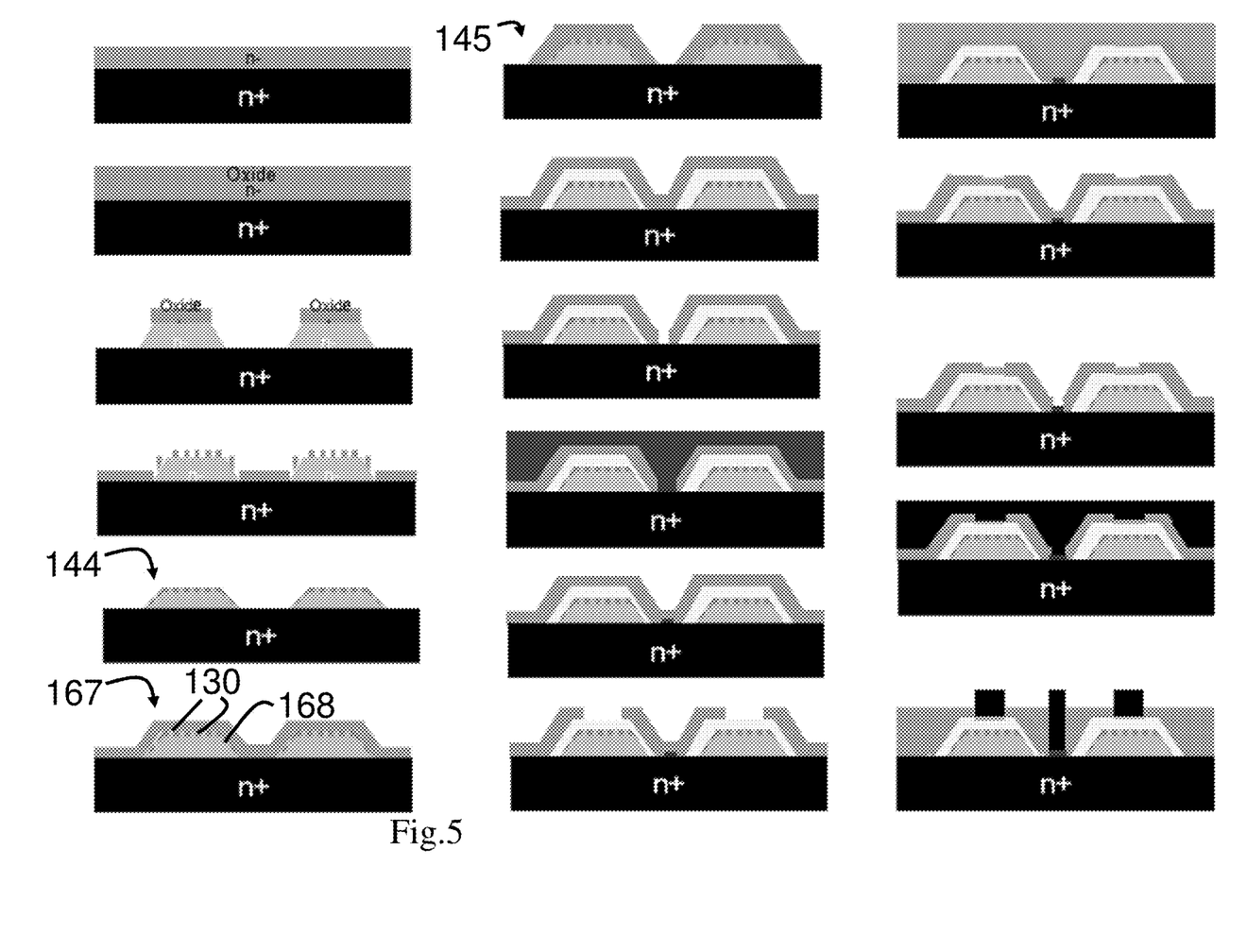
FIG. 5 shows the method steps of forming the silicon carbide diode array in FIG. 3.

Turning now to FIG. 5, another embodiment of the present invention shows a different method of producing a silicon carbide diode array. Most of the features of the method are similar to those of the method in FIG. 4 so they will not be described again here for the sake of brevity. Only the difference between the methods in FIG. 5 and FIG. 4 will be described herein. In FIG. 5, one can see that there is an additional Step 167 after the Step 144 of p implantation and annealing, and before the Step 145 of ILD deposition. In Step 167 an n-type epitaxial layer 168 is grown on top of the entire device, and the extra n-type epitaxial layer 168 achieves the effect of "burying" the previously p-type silicon carbides 130, as the n-type epitaxial layer 168 becomes part of the silicon carbide layer. The resultant silicon carbide diode array from the method shown in FIG. 5 is then the one shown in FIG. 3.

Figure 6:
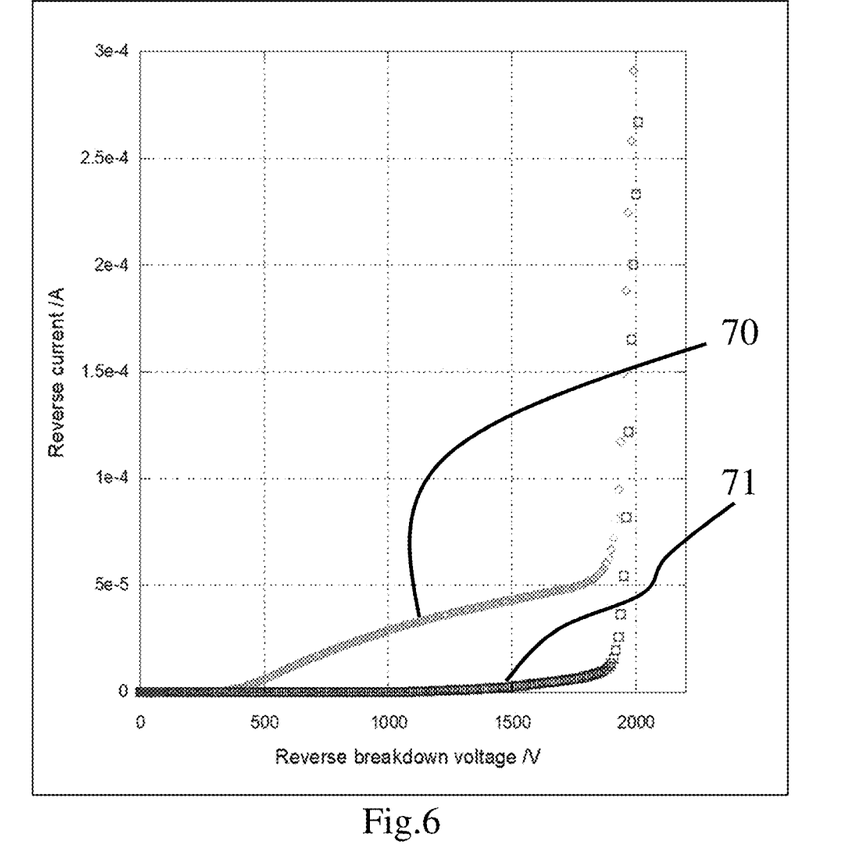
FIG. 6 shows the comparison of simulation results of silicon carbide diode arrays with only one and multiple p-type silicon carbides on the inclined side face respectively.
Figure 7:
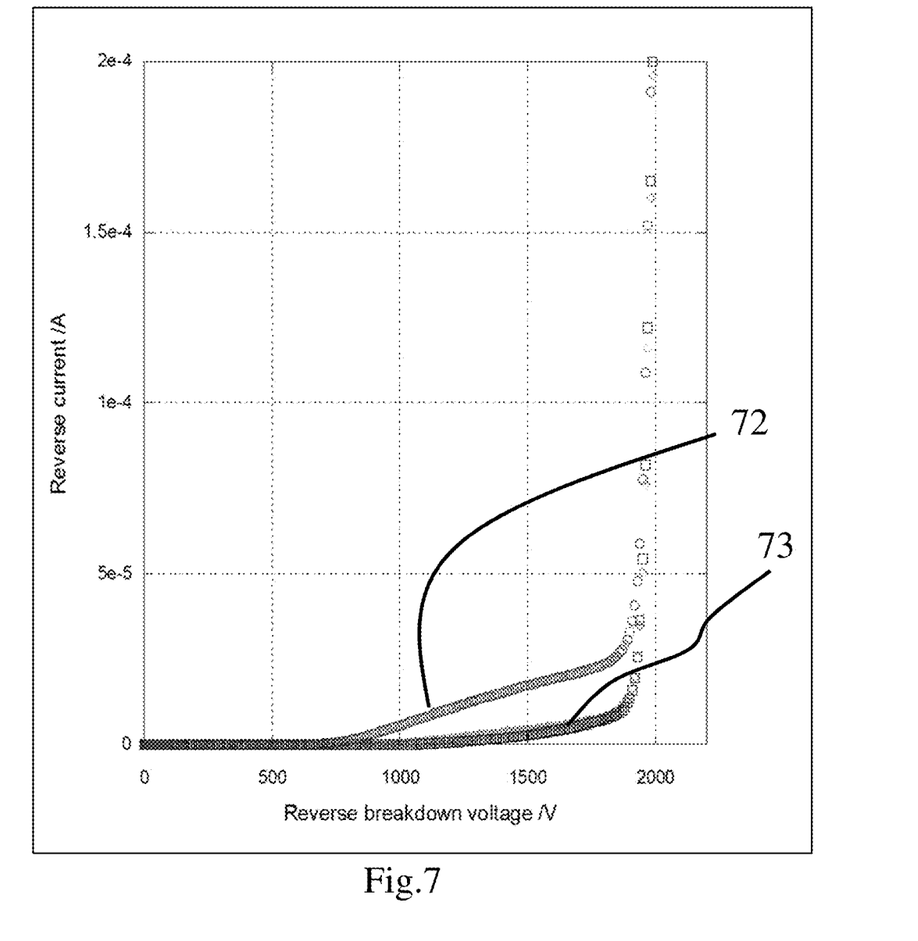
FIG. 7 shows the comparison of simulation results of silicon carbide diode arrays with an inclination angle of being smaller than 45° and being equal or larger than 45° respectively.

FIGS. 6 and 7 show respectively some simulation results of the embodiments of the present invention. In particular, FIG. 6 shows the reverse characteristic (in terms of the reverse breakdown voltage versus the reverse current) for silicon carbide diode array with only one p implantation on the side face of the portion of silicon carbide layer, and that with multiple p-type silicon carbides. One can see that the set of point plot 70 indicating the case of one p implantation results in a higher leakage current as compared to the set of point plot 71 indicating the case of multiple p-type silicon carbides. In other words, the performance of the silicon carbide diode array with multiple p-type silicon carbides on the inclined trench is superior to the performance of silicon carbide diode array with only one p implantation on the inclined trench. In FIG. 7, the reverse characteristic (in terms of the reverse breakdown voltage versus the reverse current) for silicon carbide diode array with an inclined trench slope<45° (that is, the angle between the side wall of the portion 24 and the silicon carbide substrate 20 in FIG. 2), and that with an inclined trench slope>=45°. One can see that the set of point plot 72 indicating the case of an inclined trench slope<45° results in a higher leakage current as compared to the set of point plot 73 indicating the case of an inclined trench slope>=45°. In other words, the performance of the silicon carbide diode array with an inclined trench slope>=45° is superior to the performance of silicon carbide diode array with an inclined trench slope<45°.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

For example, in FIGS. 2 and 3 the exemplary embodiments show each of the portion of the n− type silicon carbide layer have two inclined side faces, forming a trapezoidal cross-section. However, skilled persons would realize in other variations of the invention there can be only one, or three or more inclined side faces of a separate portion which is used as the anode. Other inclined side faces may be vertical to the silicon carbide substrate, for example. For the inclined side faces, the angle between the side face and the substrate can also vary within the range of 0° to 90°.

Also, in FIGS. 2 and 3 the exemplary embodiments show two anodes of the diode array and one cathode, thus forming a pair of diodes. Skilled persons would understand that there can be other number of anodes in the array in variations of the invention, thus forming more than two diodes.

FIG. 6 above shows the comparison of silicon carbide diode arrays with only one p implantation and multiple p-type silicon carbides, and FIGS. 2-3 show the case of two p-type silicon carbides on each inclined side face. It is possible that in other embodiments of the invention the number of p-type silicon carbides on the inclined side face can be varied, for example three or more.

According to embodiments of the invention, the inclined trench depth (which is the depth of the portion 24 in the case of FIG. 2) can be varied from 2 μm to 300 μm.

What is claimed is:

1. A silicon carbide chip array, comprising:
a) a silicon carbide substrate;
b) a silicon carbide layer on top of the silicon carbide substrate, the silicon carbide layer being thinner and having lower doping than the silicon carbide substrate; the silicon carbide layer comprising a first portion and a second portion which are separate from each other;
c) a first metal contact connected to the silicon carbide substrate;
d) two second metal contacts connected to the first portion and the second portion respectively; each one of the second metal contacts forming a semiconductor device with the first metal contact; and
e) a dielectric layer on top of the silicon carbide substrate;
wherein the first and second portions comprise a side face which is inclined with respect to the silicon carbide substrate and the side face forms an acute angle with the silicon carbide substrate;
wherein the dielectric layer encapsulates a part of the silicon carbide layer, between the first metal contact and at least one of the two said second metal contacts, that that includes one said side face;
wherein the first portion and the second portion each comprise one said side face that is opposing each other; the first metal contact being on top of the silicon carbide substrate and located between the two side faces; the second metal contacts being on top of the silicon carbide substrate; and
wherein at least one of the first and second portions further comprises, at least partially along the side face, a plurality of p-type silicon carbides.

2. The silicon carbide chip array according to claim 1, wherein the plurality of p-type silicon carbides are buried under the side face at a distance.

3. The silicon carbide chip array according to claim 1, wherein the plurality of p-type silicon carbides has edges thereof substantially contacting the side face.

4. The silicon carbide chip array according to claim 1, wherein the first metal contact functions as a common cathode, and the second metal contacts function as anodes respectively.

5. The silicon carbide chip array according to claim 4, wherein the semiconductor device is a diode, such that the silicon carbide chip array forms a diode pair.

6. The silicon carbide chip array according to claim 1, wherein the first metal contact or the second metal contacts are formed by seed layer deposition and subsequent electroplating.

7. The silicon carbide chip array according to claim 1, wherein an inclined trench depth is from 2 μm to 300 μm.

8. The silicon carbide chip array according to claim 1, wherein the dielectric layer is made of a material which is adapted to prevent a reverse leakage current or breakdown between the first metal contact and the side face; the dielectric layer having a thickness between the first metal contact and the one side face that increases along a direction away from the top of the silicon carbide substrate.

9. The silicon carbide chip array according to claim 1, wherein the first metal contact or the second metal contacts are made of a metal selected from the followings: titanium (Ti), nickel (Ni), titanium nitride (TiN), titanium aluminum (TiAl) and platinum (Pt).

10. The silicon carbide chip array according to claim 1, wherein the side face forms an angle equal to or greater than 45° with a top face of the silicon carbide substrate.

11. The silicon carbide chip array according to claim 10, wherein the acute angle is in the range of 45°-60°.

12. The silicon carbide chip array according to claim 1, wherein on each said side face there are only two said p-type silicon carbides.

13. A method of producing a silicon carbide chip array, comprising the steps of:
a) providing a silicon carbide layer on top of a silicon carbide substrate; the silicon carbide layer being thinner and having lower doping than the silicon carbide substrate;
b) forming a first portion and a second portion from the silicon carbide layer and which are separate from each other; the first and second portions comprise a side face which is inclined with respect to the silicon carbide substrate; the side face forming an acute angle with the silicon carbide substrate; the first portion and the second portion each comprising one said side face that is opposing each other; a first metal contact being on top of the silicon carbide substrate and located between the two side faces; two second metal contacts being on top of the silicon carbide substrate; at least one of the first and second portions further comprising, at least partially along the side face, a plurality of p-type silicon carbides;
c) depositing a dielectric layer on top of the silicon carbide substrate; wherein the dielectric layer encapsulates a part of the silicon carbide layer, between the first metal contact and at least one of the two said second metal contacts, that includes one said side face;
d) forming the first metal contact connected to the silicon carbide substrate; and
e) forming the two second metal contacts connected to the first portion and the second portion respectively; each one of the second metal contacts forming a semiconductor device with the first metal contact.

14. The method according to claim 13, wherein the step of forming the first portion and the second portion further comprises the steps of masking and etching.

15. The method according to claim 13, further comprises the step of forming the plurality of p-type silicon carbides at least partially along the side face.

16. The method according to claim 15, wherein the step of forming the plurality of p-type silicon carbides further comprises p-type impurity implantation and subjecting to annealing.

17. The method according to claim 16, wherein the step of forming the plurality of p-type silicon carbides further comprises the step of growing an additional layer on top of the silicon carbide layer to cover the plurality of p-type silicon carbides.

* * * * *